United States Patent [19]
Steffan et al.

[11] Patent Number: 6,084,679
[45] Date of Patent: Jul. 4, 2000

[54] UNIVERSAL ALIGNMENT MARKS FOR SEMICONDUCTOR DEFECT CAPTURE AND ANALYSIS

[75] Inventors: Paul J. Steffan, Elk Grove; Allen S. Yu, Fremont, both of Calif.

[73] Assignee: Advanced Micro Devices, Inc., Sunnyvale, Calif.

[21] Appl. No.: 09/285,430

[22] Filed: Apr. 2, 1999

[51] Int. Cl.[7] .................................................. G01B 11/00
[52] U.S. Cl. .......................................... 356/401; 356/399
[58] Field of Search ................................ 356/399, 400, 356/401

[56] References Cited

U.S. PATENT DOCUMENTS 5,910,847  6/1999  Van der Werf et al. ................ 356/401

Primary Examiner—Robert H. Kim
Attorney, Agent, or Firm—H. Donald Nelson

[57] ABSTRACT

A method of using universal alignment marks on a semiconductor wafer that allows the accurate alignment of scanning and analysis tools in relation to the semiconductor wafer. The information in the universal alignment marks are utilized by a vendor generated algorithm incorporated into the respective scanning or analysis tools to accurately position the tool in relation to the semiconductor wafer.

2 Claims, 2 Drawing Sheets

UNIVERSAL ALIGNMENT MARKS FOR SEMICONDUCTOR DEFECT CAPTURE AND ANALYSIS

BACKGROUND OF THE INVENTION

1. Field of the Invention

This invention relates generally to defect capture and analysis during the manufacture of semiconductor wafers. More specifically, this invention relates to defect capture and analysis in which tools used to capture defects and tools used to analyze the captured defects utilize universal alignment marks to record positions of defects and to find the captured defects for analysis.

2. Discussion of the Related Art

In order to remain competitive, a semiconductor manufacturer must continuously increase the performance of the semiconductor integrated circuits being manufactured and at the same time, reduce the cost of the semiconductor integrated circuits. Part of the increase in performance and the reduction in cost of the semiconductor integrated circuits is accomplished by shrinking the device dimensions and by increasing the number of circuits per unit area on an integrated circuit chip. Another part of reducing the cost of a semiconductor chip is to increase the yield. As known in the semiconductor manufacturing art, the yield of chips (also known as die) from each wafer is not 100% because of defects caused during the manufacturing process. The number of good chips obtained from a wafer determines the yield. As can be appreciated, chips that must be discarded because of a defect increases the cost of the remaining usable chips.

A single semiconductor wafer can require numerous processing steps such as oxidation, etching, metallization and wet chemical cleaning. Some of these processing steps involve placing the wafer on which the semiconductor chips are being manufactured into different tools during the manufacturing process. The optimization of each of these processing steps requires an understanding of a variety of chemical reactions and physical processes in order to produce high performance, high yield circuits. The ability to view and characterize the surface and interface layers of a semiconductor chip in terms of their morphology, chemical composition and distribution is an invaluable aid to those involved in research and development, process, problem solving, and failure analysis of integrated circuits. A major part of the analysis process is to determine if defects are caused by one of the process tools, and if so, which tool caused the defects.

As the wafer is placed into different tools during manufacture, each of the tools can produce different types of particles that drop onto the wafer and cause defects that have the potential to decrease the yield. In order to develop high yield semiconductor processes and to improve existing ones, it is important to identify the sources of the various particles that cause defects and then to prevent the tools from dropping these particles onto the wafer while the wafers are in the tools.

One approach used to identify the source of the particles is to analyze the particles as they lie on the wafer surface. A number of particle detectors have been developed to measure the number, location, and the size of the particles on the wafer surface. One type of particle detector is known as the laser surface particle detector (LSPD). However, the information provided by the LSPD, by itself, is sometimes not sufficient for identifying the source of the particles. In almost all cases, the particle must be further analyzed to identify what type of particle it is to assist in the determination of the source of the particle. A scanning electron microscope (SEM) equipped with an energy dispersive x-ray spectroscopy (EDS) system works well for measuring the morphology and chemical composition of particles. However, it is nearly impossible to find particles with a SEM on a relatively clean wafer surface. A technique was developed that uses a combination of the LSPD to locate particles on the wafer surface and the SEM/EDS system to analyze the particles. One of the combined systems is known as the Particle Analysis System (PAS) and this system and similar systems are used throughout the semiconductor industry. The PAS has been effective in identifying most particle contamination problems. However, as chip technology improves and device geometry shrinks, particles that can cause defects are also smaller. This requires that the analysis system be able to detect and analyze smaller particles. The major problem in the analysis of small particles with a PAS or similar system is the problem of finding the particles with the SEM after they have been identified by the LSPD. The limiting factor is the positioning accuracy of the LSPD, which may be insufficient to allow the SEM to use the minimum magnification to see the particles. The current industry standard is that a minimum of 1500× magnification is usually required on the SEM in order to see a 0.16 micron particle. For a typical CRT screen, this magnification translates to a field of view of 70×70 microns. This means that a particle's position must be known with an error less than 35 to 40 microns in order for the SEM to find the particle. As the position error increases, analysis time is wasted searching for particles. When the position error exceeds 100 microns an inordinate amount of time must be taken searching for particles.

A representative PAS system includes a Tencor 6200 LSPD and a JEOL 848 SEM equipped with a Kevex EDS. Typically, in such systems, a PC (personal computer) is used for data transfer between the LSPD and the SEM and for the manipulation of the data. The LSPD detects particles using a light scattering technique. The wafer is loaded into the LSPD chamber and the laser is raster-scanned over the wafer surface while the wafer is moved orthogonally to the scan direction. When the laser intersects a particle, light is scattered by the particle onto a detector. The magnitude of the light scattering signal provides information about the particle size. The measurement of the particle's position is more complicated. The position of the laser is known as a function of time and the scattering events produce a data file that contains the size and the x-y coordinates of each particle detected on the wafer surface. The wafer is then removed from the LSPD and loaded into a SEM. However, the coordinate system used by the x-y stage of the SEM is not the same as the coordinate system used by the LSPD. As a result, the wafer's orientation in the LSPD coordinate system differs from the wafer's orientation in the SEM's coordinate system. The PC must be able to transform the coordinate system used by the LSPD to the coordinate system used by the SEM.

To optimize the performance of PAS systems, it is necessary to improve the accuracy of particle position maps by reducing the targeting error. The targeting error is defined as the difference between particle positions predicted by the LSPD and the particle positions observed on the x-y stage. The source of nearly all the targeting error is caused by uncertainties in the LSPD particle map. A typical LSPD measures particle position with a resolution that exists as a rectangular region of 10 microns by 26 microns, however, this position is referenced to a less-accurately determined coordinate system. The coordinate system is aligned to the wafer in a specific orientation with respect to the wafer's center and notch positions. These positions are determined using a lower resolution (26 microns by 120 microns) measurement of the wafer's edge geometry. Ideally the alignment is insensitive to the wafer's orientation during scanning. From the uncertainties produced by resolution limits, it is expected that the LSPD will provide a relatively accurate particle position map, but one that is referenced to a significantly misaligned coordinate system. Therefore, a key step in the prior art in reducing the targeting error is to eliminate coordinate system misalignment. Another method in the prior art for reducing targeting error involves averaging multiple particle positions maps to reduce the influence of random uncertainties.

As the design rules of semiconductor manufacturing processes require semiconductor devices to achieve even higher densities, as more layers and interlayer dependencies are added, and as processes become increasingly complex, the role of miniscule optically unresolvable defects will move to the forefront of yield limiting problems. These defects are caught and reported by a variety of scan tools at various layers or operations in a semiconductor process flow. Since these scan tools have a specific purpose, that is, finding defects, they are generally poor at analyzing the defects caught. Another set of tools, including SEM, TEM, Auger, FIB, high-resolution optical microscopes, UV scopes are used to analyze the defects caught by the scan tools. The purpose of the two sets of tools is to quickly determine the root cause and elimination of defects.

Current practice in the semiconductor industry for finding and assigning locations to defects caught by a scan tool is non-standard and inconsistent with each individual equipment vendor developing techniques as varied as the tools are themselves. Some systems align themselves to a reticle pattern on the wafer, positioning all defects caught in relation to an absolute 0,0 die location which is arbitrarily assigned based on the original alignment position selected by the person who sets up the recipe to be the center. Other systems assign the 0.0 location such that all die are described as being in the positive x,y, quadrant. Other systems attempt to find the exact center of a wafer by performing a 3 point alignment using the edges of the wafer and using geometry to find the center. Many, if not all of these methods do not attempt to take into account the orientation of the notch (or wafer flat) when assigning their coordinate systems. Also, many of these systems are not accurate enough to place the defect within the tolerances needed for many CIM base yield models, or for recapture on a high magnification analysis tool.

The problem of trying to recapture a defect on an analysis tool that was originally caught by a scan tool still exists. Since, for the most part, defects are arbitrarily "placed" by a scan tool with a totally independent coordinate system, it is virtually impossible for an analysis tool to recapture the defects without many frustrated hours of attempts to "align" the wafer to the coordinate system used by the analysis tool. Many algorithms have been developed to translate one coordinate system to another, but these are not perfect and are considered bandages to the overall problem. This requires, however, that the vendor of an analysis tool must provide a translation algorithm for each scan tool that may be used to scan for defects.

Therefore, what is needed is universal global alignment system that would be incorporated by the vendors of each scan tool and the vendors of each analysis tool.

SUMMARY OF THE INVENTION

According to the present invention, the foregoing and other objects and advantages are attained by a method of using universal alignment marks on a semiconductor wafer.

In accordance with an aspect of the invention, a semiconductor wafer having at least two universal alignment marks are placed in a scan tool, the scan tool is aligned to the two universal alignment marks with vendor incorporated algorithm in the scan tool and defects and their positions are accurately captured by the scan too.

In accordance with another aspect of the invention, the semiconductor wafer is placed in an analysis tool, which is aligned to the at least two universal alignment marks with a vendor incorporated algorithm in the analysis tool and the defects captured by the scan tool are analyzed.

The described method thus effectively provides a method to accurately position scan tools and analysis tools by the use of vendor generated algorithms incorporated into the respective scan tools and analysis tools to utilize information contained in the pattern of the universal alignment marks.

The present invention is better understood upon consideration of the detailed description below, in conjunction with the accompanying drawings. As will become readily apparent to those skilled in the art from the following description, there is shown and described an embodiment of this invention simply by way of illustration of the best mode to carry out the invention. As will be realized, the invention is capable of other embodiments and its several details are capable of modifications in various obvious aspects, all without departing from the scope of the invention. Accordingly, the drawings and detailed description will be regarded as illustrative in nature and not as restrictive.

BRIEF DESCRIPTION OF THE DRAWINGS

The novel features believed characteristic of the invention are set forth in the appended claims. The invention itself, however, as well as a preferred mode of use, and further objects and advantages thereof, will best be understood by reference to the following detailed description of an illustrative embodiments when read in conjunction with the accompanying drawings, wherein:

DETAILED DESCRIPTION

Reference is now made in detail to specific embodiments of the present invention which illustrate the best mode presently contemplated by the inventors for practicing the invention.

Figure 1:
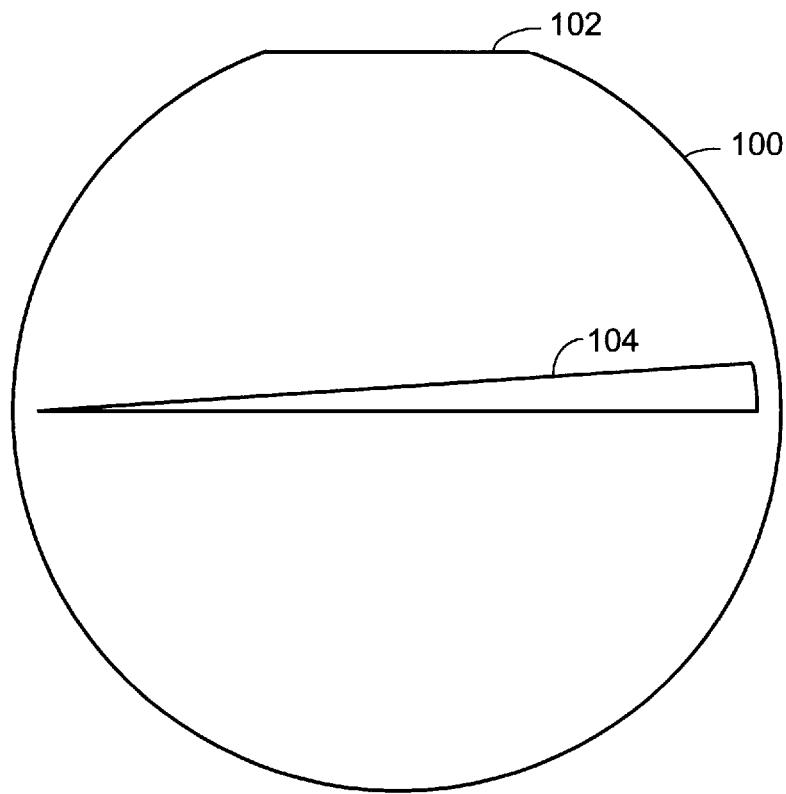
FIG. 1 is a blank wafer with a flat area on the perimeter of the wafer used for orientation purposes and with a diagram showing the effect of rotation of the wafer.
Figure 2:
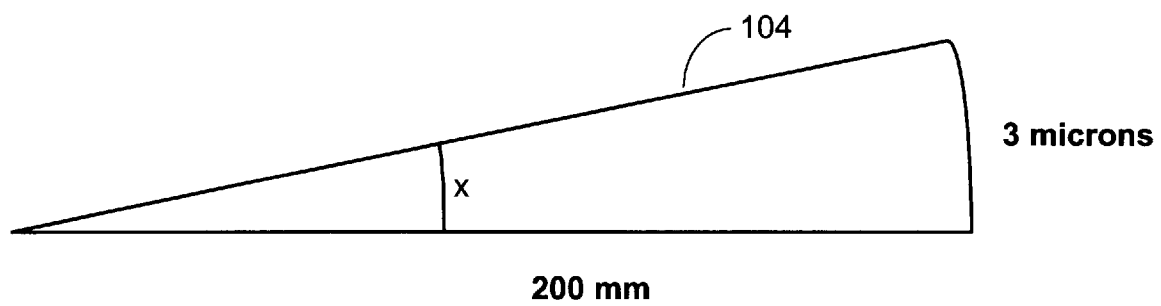
FIG. 2 is an enlargement of the diagram shown in FIG. 1 showing the effect of rotation of the wafer.

FIGS. 1 & 2 illustrate the effects of a small misalignment of a wafer 100 placed in an analysis tool. As is known in the semiconductor manufacturing art, the wafer 100 is marked in some way so that the orientation of the wafer can be determined as it is being transferred from one process tool to another. The wafer 100 is FIG. 1 is shown having a flat edge 102 on the perimeter of the wafer 100. Other methods of determining the orientation of a wafer such as the wafer 100 including notching the wafer. The triangle 104 in FIG. 1 represents the wafer being rotated (skewed) from its correct position after being transferred from one process tool to the next or as the wafer is transferred from a scan tool to an analysis tool. The triangle 104 is shown enlarged in FIG. 2 and shows that if the wafer is rotated (skewed) by as little as 0.1 degree, a particle 100 mm from the center will have an error in position of 175 microns, calculated as follows:

tangent (skew angle)=position error/distance from center=tangent 0.1°=position error/100 mm=0.00175=>position error=0.175 mm=175 microns.

As the dimensions of the semiconductor devices being manufactured, smaller and smaller defects have the capability to be killer defects and as such must be able to be captured and analyzed. In order to capture a defect on the order of 3 microns across a 200 mm wafer, the orientation of the wafer must be accurate to an angle 0.001 to 0.0005, calculated as follows:

Tangent $x$=3 $\mu$m/200 mm=an angle between 0.0005 and 0.001 degrees.

Figure 3:
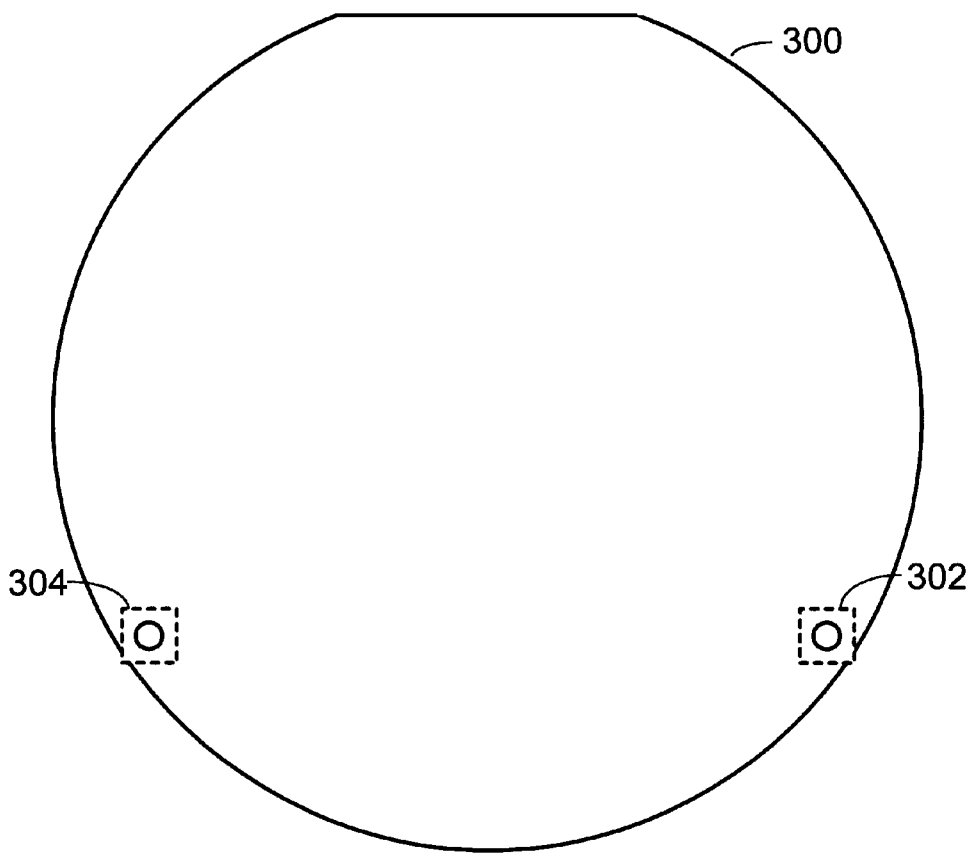
FIG. 3 shows a blank wafer with two positions for the placement of the universal alignment marks in accordance with the present invention.

FIG. 3 shows a blank wafer 300 showing two positions 302 and 304 within dashed lines in which universal alignment marks can be placed. It should be appreciated that other positions along the periphery can be used to position the universal alignment marks.

Figure 4:
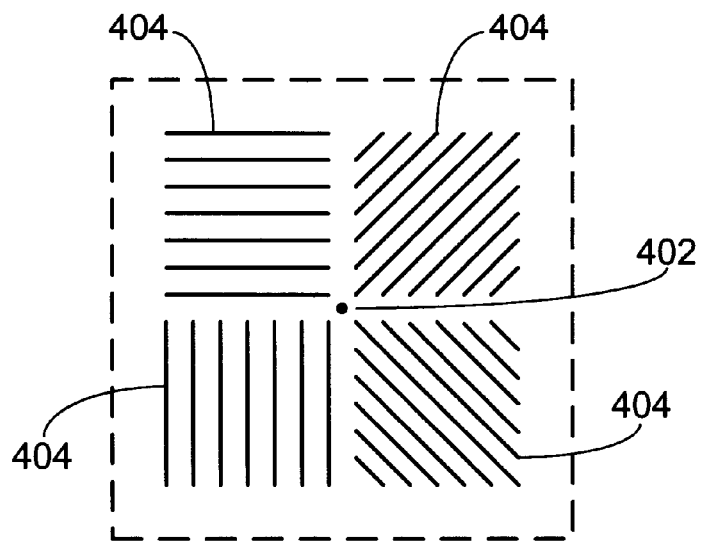
FIG. 4 shows an example of a universal alignment mark that can be used in accordance with the present invention.

FIG. 4 illustrates a mark 400 that could be used as a universal alignment mark that would be used by a scan tool or an analysis tool to establish an accurate coordinate system. Upon adoption of a mark such as the one shown in FIG. 4, each tool vendor would incorporate an algorithm that would use the alignment marks to accurately position the optical or other observing element in the analysis tool. The point indicated at 402 represents the exact alignment position. The point indicated at 402 could be a cross or any other mark that would be recognized by the tool during the positioning of the tool relative to the semiconductor wafer. The lines 404 can be used to guide the alignment algorithm in the scan tool or the analysis tool to position the observing element. The design and orientation of the lines selected for the universal alignment mark could have any combination and orientation of lines. Whatever combination and orientation of lines selected for the universal alignment marks would be accommodated by the positioning algorithm incorporated in the scan and analysis tools or any other tool that would use the universal alignment marks to align itself in relation to the semiconductor wafer. The universal alignment marks can be placed on the semiconductor wafers by the silicon wafer manufacturer or by the receiving fabrication plant with a laser marker and are placed near the edge of the wafer in a set of two marks for complete global alignment. The marks must be of sufficient endurance to be visible despite undergoing the rigors of modern semiconductor manufacturing environments and processes.

The benefits of using the universal alignment marks are as follows:

1. The universal alignment marks eliminate the usage of wrong alignment points in scan recipe setup.

2. The universal alignment marks allow for simple recipe setup and auto-alignment of the tool in relation to the semiconductor wafer.

3. The universal alignment marks provide precise location information of defects with standard wafer orientation.

In summary, the results and advantages of the universal alignment marks can now be more fully realized. The described method effectively provides a method to accurately position scan tools and analysis tools by the use of vendor generated algorithms incorporated into the respective scan tools and analysis tools to utilize information contained in the pattern of the universal alignment marks.

The foregoing description of the embodiment of the invention has been presented for purposes of illustration and description. It is not intended to be exhaustive or to limit the invention to the precise form disclosed. Obvious modifications or variations are possible in light of the above teachings. The embodiment was chosen and described to provide the best illustration of the principles of the invention and its practical application to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly, legally, and equitably entitled.

What is claimed is:

1. A method of using universal alignment marks on a semiconductor wafer for accurately capturing the position of defects in a scan tool and for analyzing defects in an analysis tool, the method comprising:

placing a semiconductor wafer having at least two universal alignment marks on a surface of the semiconductor wafer into a scan tool;

aligning the scan tool to the at least two universal alignment marks with a vendor incorporated algorithm in the scan tool; and capturing defects and positions of the defects on the surface of the semiconductor wafer with the scan tool.

2. The method of claim 1, further comprising:

placing the semiconductor wafer in an analysis tool;

aligning the analysis tool to the at least two universal alignment marks with a vendor incorporated algorithm in the analysis tool; and analyzing the defects captured by the scan tool.

* * * * *